United States Patent
Bratkovski et al.

(10) Patent No.: US 8,471,270 B2
(45) Date of Patent: Jun. 25, 2013

(54) INDIRECT-BANDGAP-SEMICONDUCTOR, LIGHT-EMITTING DIODE

(75) Inventors: Alexandre M. Bratkovski, Mountain View, CA (US); Viatcheslav Osipov, E. Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 3 days.

(21) Appl. No.: 13/257,393

(22) PCT Filed: Mar. 23, 2009

(86) PCT No.: PCT/US2009/037962
§ 371 (c)(1),
(2), (4) Date: Sep. 19, 2011

(87) PCT Pub. No.: WO2010/110781
PCT Pub. Date: Sep. 30, 2010

(65) Prior Publication Data
US 2012/0012863 A1     Jan. 19, 2012

(51) Int. Cl.
*H01L 27/15* (2006.01)
*H01L 29/18* (2006.01)
*H01L 31/12* (2006.01)
*H01L 33/00* (2010.01)

(52) U.S. Cl.
USPC ................ 257/87; 257/79; 257/80; 257/84; 257/86; 257/E33.046; 257/E33.001; 257/E33.067

(58) Field of Classification Search
USPC ................ 257/79, 83–87, E27.119, E27.001, 257/E33.046, E33.001, E33.009, E33.01, 257/E33.067
See application file for complete search history.

(56) References Cited

U.S. PATENT DOCUMENTS

| | | |
|---|---|---|
| 5,210,766 A | 5/1993 | Winer et al. |
| 2005/0017257 A1 | 1/2005 | Green et al. |
| 2012/0175586 A1* | 7/2012 | Bratkovski et al. ............ 257/13 |

FOREIGN PATENT DOCUMENTS

| | | |
|---|---|---|
| JP | 08-046237 | 2/1996 |
| JP | 2008508702 | 3/2008 |

* cited by examiner

*Primary Examiner* — Chuong A Luu
*Assistant Examiner* — Cory Eskridge

(57) ABSTRACT

An indirect-bandgap-semiconductor, light-emitting diode. The indirect-bandgap-semiconductor, light-emitting diode includes a plurality of portions including a p-doped portion of an indirect-bandgap semiconductor, an intrinsic portion of the indirect-bandgap semiconductor, and a n-doped portion of the indirect-bandgap semiconductor. The intrinsic portion is disposed between the p-doped portion and the n-doped portion and forms a p-i junction with the p-doped portion, and an i-n junction with the n-doped portion. The p-i junction and the i-n junction are configured to facilitate formation of at least one hot electron-hole plasma in the intrinsic portion when the indirect-bandgap-semiconductor, light-emitting diode is reverse biased and to facilitate luminescence produced by recombination of a hot electron with a hole.

20 Claims, 4 Drawing Sheets

INDIRECT-BANDGAP-SEMICONDUCTOR, LIGHT-EMITTING DIODE

TECHNICAL FIELD

Embodiments of the present technology relate generally to the field of light-emitting diodes (LEDs), and the utilization of a LED as an optical output driver for optical interconnection between integrated circuits (ICs).

BACKGROUND

The flow and processing of information creates ever increasing demands on the speed with which microelectronic circuitry processes such information. In particular, means of communicating between electronic devices over communication channels having high-bandwidth and high-frequency are of critical importance in meeting these demands.

Communication by means of optical channels has attracted the attention of the scientific and technological community to meet these demands. However, a basic incompatibility exists between the technology used for optical signal generation, which relies primarily on III-V semiconductor compounds, and the technology used for information processing, which relies on silicon-based, complementary-metal-oxide-semiconductor (CMOS) integrated circuits (ICs). Scientists engaged in the development of ultra-large-scale integration (ULSI) of microelectronic devices are keenly interested in finding a means for reconciling these disparate technologies. Thus, research scientists are actively pursuing new approaches for meeting these demands.

DESCRIPTION OF THE DRAWINGS

The accompanying drawings, which are incorporated in and form a part of this specification, illustrate embodiments of the technology and, together with the description, serve to explain the embodiments of the technology.

Figure 1:
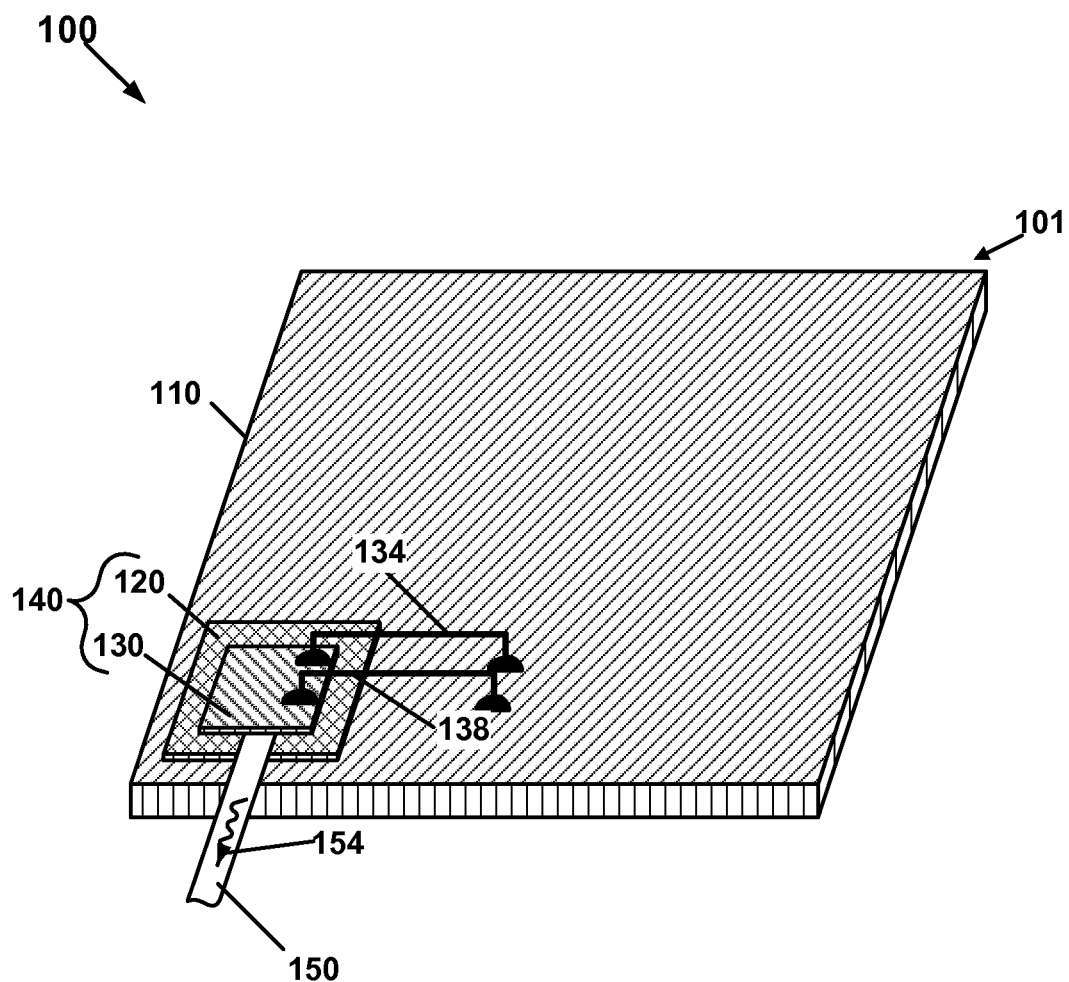
FIG. 1 is a perspective view of a combined indirect-bandgap-semiconductor, light-emitting diode (LED), light modulator and integrated-circuit (IC) device illustrating an example environment in which the indirect-bandgap-semiconductor LED finds particular utility, as well as further illustrating the functional arrangement of the indirect-bandgap-semiconductor LED, the light modulator and the IC in the example environment of the device, in an embodiment of the present technology.

The drawings referred to in this description should not be understood as being drawn to scale except if specifically noted.

DESCRIPTION OF EMBODIMENTS

Reference will now be made in detail to the alternative embodiments of the present technology. While the technology will be described in conjunction with the alternative embodiments, it will be understood that they are not intended to limit the technology to these embodiments. On the contrary, the technology is intended to cover alternatives, modifications and equivalents, which may be included within the spirit and scope of the technology as defined by the appended claims.

Furthermore, in the following description of embodiments of the present technology, numerous specific details are set forth in order to provide a thorough understanding of the present technology. However, it should be noted that embodiments of the present technology may be practiced without these specific details. In other instances, well known methods, procedures, and components have not been described in detail as not to unnecessarily obscure embodiments of the present technology.

Embodiments of the present technology include an indirect-bandgap-semiconductor, light-emitting diode (LED). The indirect-bandgap-semiconductor LED includes a plurality of portions including a p-doped portion of a indirect-bandgap semiconductor, an intrinsic portion of the indirect-bandgap semiconductor, and a n-doped portion of the indirect-bandgap semiconductor. The intrinsic portion is disposed between the p-doped portion and the n-doped portion and forms a p-i junction with the p-doped portion, and an i-n junction with the n-doped portion. The p-i junction and the i-n junction are configured to facilitate formation of at least one hot electron-hole plasma in the intrinsic portion when the indirect-bandgap-semiconductor LED is reverse biased and to facilitate luminescence produced by recombination of a hot electron with a hole.

Embodiments of the present technology are directed to a silicon-based and complementary-metal-oxide-semiconductor (CMOS) compatible LED structure. A hot electron-hole plasma is created by reverse-biasing a p-i-n diode structure. Hot electrons that populate the center of the Brillouin zone at the Γ-point are produced by impact ionization of electrons from the bottom of the conduction band that create the hot electron-hole plasma, and by Auger transitions between hot electrons and holes. Light may then be produced by direct recombination of the hot electrons with holes at the center of the Brillouin zone at the Γ-point. The direct recombination of the hot electrons with holes results in much more efficient production of light, or luminescence, for embodiments of the present technology as an indirect-bandgap-semiconductor LED, than light produced by indirect transitions in LEDs that might otherwise be made from indirect-bandgap semiconductors. Thus, the term of art "hot-electron-luminescence LED" has been coined by the inventors to describe embodiments of the present technology for the indirect-bandgap-semiconductor LED.

With reference now to FIG. 1, in accordance with an embodiment of the present technology, a perspective view 100 of a combined indirect-bandgap-semiconductor LED, light modulator and integrated-circuit (IC) device 101 is shown. FIG. 1 also illustrates the functional arrangement of an indirect-bandgap-semiconductor LED 120, a light modulator 130 and an IC 110, also known by the term of art "chip," of a combined indirect-bandgap-semiconductor LED, light modulator and IC device 101. FIG. 1 illustrates an example environment in which the indirect-bandgap-semiconductor LED 120 finds particular utility. In particular, embodiments of the present technology for the indirect-bandgap-semiconductor LED 120, which are subsequently described in greater detail, apply to and may be incorporated within the environment of the combined indirect-bandgap-semiconductor LED, light modulator and IC device 101, as well as a combined indirect-bandgap-semiconductor LED and light modulator device 140. The combined indirect-bandgap-semiconductor LED, light modulator and IC device 101 includes IC 110 and the combined indirect-bandgap-semiconductor LED and light modulator device 140. The combined indirect-bandgap-semiconductor LED and light modulator device 140 includes the indirect-bandgap-semiconductor LED 120 integrated with the light modulator 130. The indirect-bandgap-semiconductor LED 120 includes a plurality of portions (not shown in FIG. 1, but shown in and later described in the discussion of FIG. 4) including a p-doped portion of the indirect-bandgap semiconductor, an intrinsic portion of the indirect-bandgap semiconductor, and a n-doped portion of the indirect-bandgap semiconductor. The intrinsic portion is disposed between the p-doped portion and the n-doped portion and forms a p-i junction with the p-doped portion and an i-n junction with the n-doped portion. The p-i junction and the i-n junction are configured to facilitate formation of at least one hot electron-hole plasma in the intrinsic portion when the indirect-bandgap-semiconductor LED is reverse biased and to facilitate luminescence produced by recombination of a hot electron with a hole.

With further reference to FIG. 1, in accordance with an embodiment of the present technology, the light modulator 130 is optically coupled with at least one of the plurality of portions for modulating light emitted from at least one of the portions. Moreover, the light modulator 130 is configured to receive a signal from the IC 110 for modulating light emitted from at least one of the portions. As shown in FIG. 1, light modulator 130 is coupled to the IC 110 through lines 134 and 138 that provide a signal to modulate light emitted from at least one of the portions of the indirect-bandgap-semiconductor LED 120. Although in FIG. 1 the lines are shown as running over the top of the IC 110 and the light modulator 130 is shown as lying on top of the indirect-bandgap-semiconductor LED 120, the arrangement shown is by way of illustration and not limitation, as embodiments of the present technology encompass within their spirit and scope other arrangements, for example, where the light modulator 130 lies between indirect-bandgap-semiconductor LED 120 and IC 110 with the lines 134 and 138 disposed between light modulator 130 in the IC 110. Also, an optical waveguide 150 for conducting a modulated light signal, represented by photon 154, which is emitted from the indirect-bandgap-semiconductor LED 120, after modulation by the light modulator 130, is shown in FIG. 1.

With further reference to FIG. 1, in accordance with embodiments of the present technology, the combined indirect-bandgap-semiconductor LED and light modulator device 140 provides an optical output driver for optical interconnection between ICs. Thus, the combined indirect-bandgap-semiconductor LED and light modulator device 140 provides a solution to overcoming the communication bandwidth bottleneck for rack-to-rack and chip-to-chip interconnection due to the ever increasing demands of processing information at high speeds and high densities. In accordance with embodiments of the present technology, a light collector may be optically coupled with at least one portion selected from the plurality of portions including the p-doped portion, the intrinsic portion or the n-doped portion. Alternatively, a light collector may be optically coupled with at least one portion selected from the plurality of portions consisting of the p-doped portion, the intrinsic portion and the n-doped portion. In addition, the light collector may be optically coupled with the light modulator. The light modulator may further include a Mach-Zehnder interferometer. Because the IC may include a complementary-metal-oxide-semiconductor (CMOS) silicon integrated circuit based on monolithic silicon (Si) IC technology, embodiments of the present technology solve compatibility issues that arise in attempting to use LEDs based on III-V compounds, for example, such as gallium arsenide (GaAs), which are used to fabricate conventional LEDs, by avoiding the use of III-V compound materials, which employ fabrication processes that, at the very least, are difficult to utilize in conjunction with monolithic Si IC fabrication technology. However, without embodiments of the present technology, the recombination coefficients for the production of light by indirect-bandgap semiconductors, for example, Si, germanium (Ge), and Si—Ge alloys, are typically orders of magnitude lower than for a direct-bandgap semiconductor, such as GaAs, as is next described.

Figure 2:
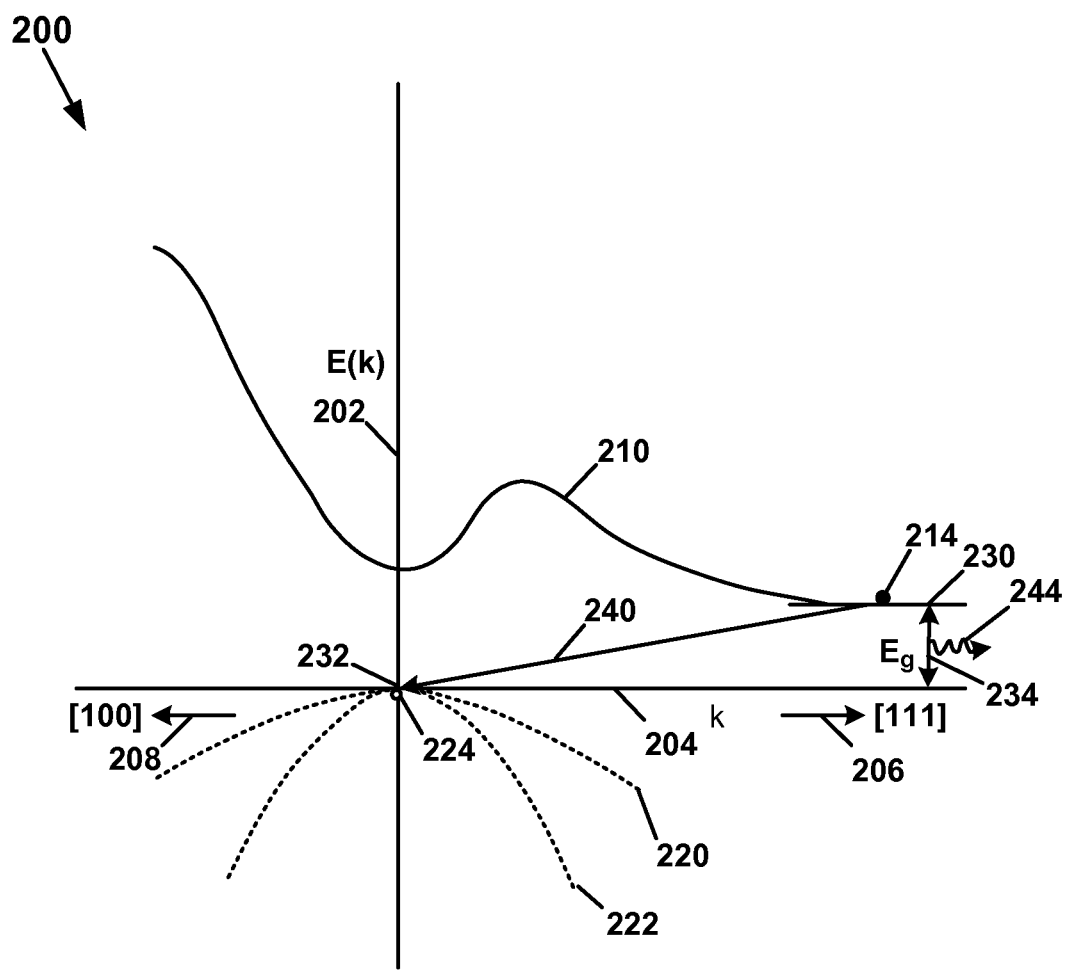
FIG. 2 is a band diagram showing a dispersion relationship in energy of electrons in a conduction band and holes in valence bands as a function of magnitude of a wave vector of the electron in the conduction band and the hole in the valence band along [111] and [100] directions in a Brillouin zone of an indirect-bandgap semiconductor, for example, germanium, and also showing recombination of an electron with a hole to produce a photon by an indirect transition, elucidating utility of embodiments of the present technology.

With reference now to FIG. 2, for the purpose of elucidating the utility of embodiments of the present technology, a band diagram 200 is shown. FIG. 2 shows a dispersion relationship in energy, E(k), of electrons in a conduction band 210 and of holes in valence bands 220 and 222 as a function of magnitude of a wave vector, k, of the electron in the conduction band 210 or the hole in the valence band, for example, one of valence bands 220 and 222, along [111] and [100] directions 206 and 208, respectively, in a Brillouin zone of an indirect-bandgap semiconductor. The band diagram 200 shown in FIG. 2 is representative of a band diagram of an indirect-bandgap semiconductor, such as Ge. Although the following discussion is based on an indirect-bandgap semiconductor, such as Ge, with a bottom 230 of the conduction band 210 at the L-point, embodiments of the present technology are not limited to such indirect-bandgap semiconductors alone, but rather indirect-bandgap semiconductors having conduction-band minima that lie more generally at other points in the Brillouin zone, for example, Si having a bottom of a conduction band at an X-point, are also within the spirit and scope of embodiments of the present technology. Ordinate 202 of the band diagram 200 is energy, E(k), of an electron in the conduction band 210 or a hole in the valence bands 220 and 222, which is given in arbitrary units, but may be, for example, electron Volts (eV). Abscissa 204 of the band diagram 200 is magnitude of the wave vector, k, of an electron in the conduction band 210 or a hole in the valence band, for example, one of valence bands 220 and 222, along [111] and [100] directions 206 and 208, respectively, in the Brillouin zone, which is given in arbitrary units of reciprocal distance, but may be, for example, $10^8$ reciprocal centimeters ($10^8$ cm$^{-1}$).

With further reference to FIG. 2, for the purpose of elucidating the utility of embodiments of the present technology, the band diagram 200 shows recombination of an electron 214 at the bottom 230 of the conduction band 210 at the L-point of the Brillouin zone with a hole 224 at a top 232 of a valence band, for example, one of valence bands 220 and 222, at the Γ-point of the Brillouin zone to produce a photon 244 by an indirect transition 240. Two valence bands 220 and 222 are shown in FIG. 2: the heavy-hole, valence band 220, and the light-hole, valence band 222. For purposes of discussion, the hole 224 may be assumed to be at the top 232 of either of the heavy-hole, valence band 220, or the light-hole, valence band 222, without loss of generality, as the top 232 of the valence bands 220 and 222 may be assumed to occur at about the same energy for either of the two valence bands 220 and 222. In the indirect transition 240, the electron 214 recombines with the hole 224 to produce the photon 244 with an energy, hv, equal to bandgap energy 234, $E_g$. The bandgap energy 234 is equal to the difference in energy between the electron 214 at the bottom 230 of the conduction band 210 and the hole 224 at the top 232 of either of the valence bands 220 and 222. Thus, energy is conserved in the indirect transition 240. However, momentum is also conserved in the indirect transition 240. Because the momentum of the electron 214 at the L-point is not equal to the momentum of the hole 224 at the Γ-point and the momentum of the photon 244 is small, another particle mediates the indirect transition 240 so that momentum is conserved. An adventitious phonon having the momentum difference between the momentum of the electron 214 at the L-point and the momentum of the hole 224 at the Γ-point can serve as such a particle. Thus, in the indirect transition 240, all three events occur: the presence of the electron 214 at the bottom 230 of the conduction band 210 at the L-point of the Brillouin zone, the presence of the hole 224 at the top 232 of a valence band, for example, one of valence bands 220 and 222, at the Γ-point of the Brillouin zone, and the presence of an adventitious phonon having the momentum difference between the momentum of the electron 214 at the L-point and the momentum of the hole 224 at the Γ-point. The probability of all three events occurring simultaneously is the product of the probabilities of each occurring so that the radiative recombination rate in an indirect-bandgap semiconductor, such as Ge, is less than that of a direct bandgap semiconductor, such as GaAs, where an adventitious phonon does not participate in the transition. Some of the utility of embodiments of the present technology lies in mitigating the effects of the low probability attending indirect transitions in indirect-bandgap semiconductors, such as Ge, and the associated low radiative recombination rates of indirect-bandgap semiconductors, such as Ge, which is next described.

Figure 3:
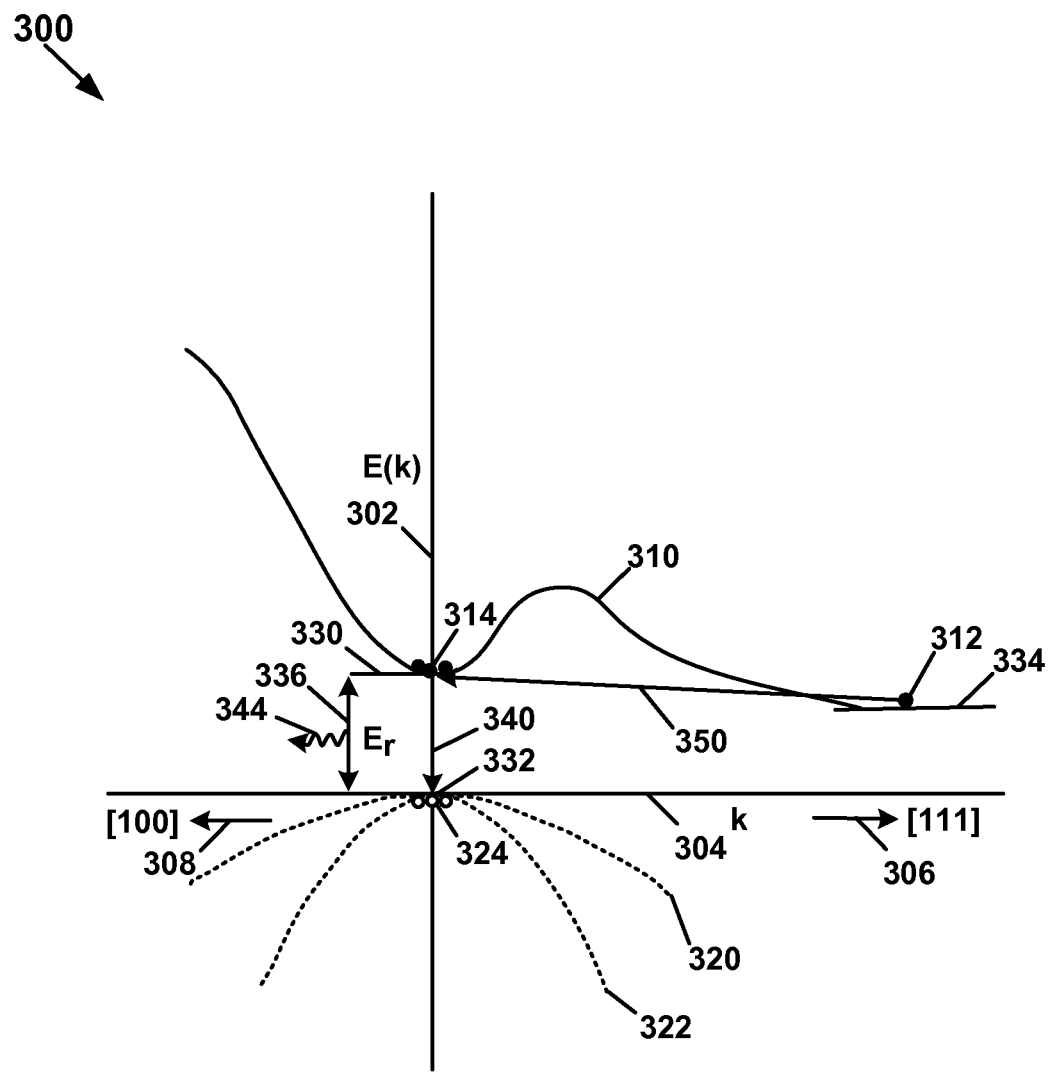
FIG. 3 is a band diagram showing a dispersion relationship in energy of electrons in a conduction band and holes in valence bands as a function of magnitude of a wave vector of the electron in the conduction band and the hole in the valence band along [111] and [100] directions in a Brillouin zone of an indirect-bandgap semiconductor, for example, germanium, and also showing recombination of a hot electron with a hole to produce a photon by a direct transition from electrons promoted to populate states located in the conduction band at a band edge at a Γ-point at the center of the Brillouin zone from a bottom of the conduction band, in an embodiment of the present technology.

With reference now to FIG. 3, in accordance with an embodiment of the present technology, a band diagram 300 is shown. FIG. 3 shows a dispersion relationship in energy, E(k), of electrons in a conduction band 310 and holes in valence bands 320 and 322 as a function of magnitude of a wave vector, k, of the electron in the conduction band 310 or the hole in the valence band, for example, one of valence bands 320 and 322, along [111] and [100] directions 306 and 308, respectively, in a Brillouin zone of an indirect-bandgap semiconductor. The band diagram 300 shown in FIG. 3 is also representative of the band diagram of an indirect-bandgap semiconductor, such as Ge. Ordinate 302 of the band diagram 300 is energy, E(k), of an electron in the conduction band 310 or a hole in the valence bands 320 and 322, which is given in arbitrary units, but may be, for example, eV. Abscissa 304 of the band diagram 300 is magnitude of the wave vector, k, of an electron in the conduction band 310 or a hole in the valence band, for example, one of valence bands 320 and 322, along [111] and [100] directions 306 and 308, respectively, in the Brillouin zone, which is given in arbitrary units of reciprocal distance, but may be, for example, $10^8$ cm$^{-1}$.

With further reference to FIG. 3, in accordance with an embodiment of the present technology, the band diagram 300 shows recombination of a hot electron 314 at a bottom 330 of the conduction band 310 at the Γ-point of the Brillouin with a hole 324 at a top 332 of a valence band, for example, one of valence bands 320 and 322, at the Γ-point of the Brillouin zone to produce a photon 344 by a direct transition 340 from electrons, for example, electron 312, promoted, indicated by transition 350, to the bottom 330 of a valley in the conduction band 310 to populate a state located at the center of the Brillouin zone at the Γ-point from a bottom 334 of the conduction band 310 at the Γ-point. Two valence bands 320 and 322 are shown in FIG. 2: the heavy-hole, valence band 320, and the light-hole, valence band 322. In the direct transition 340, the hot electron 314 recombines with the hole 324 to produce the photon 344 with an energy, hv, equal to bandgap energy 336, $E_Γ$, at the Γ-point. The bandgap energy 336, $E_Γ$, at the Γ-point is equal to the difference in energy between the hot electron 314 at the bottom 330 of the valley in the conduction band 310 at the Γ-point and the hole 324 at the top 332 of either of the valence bands 320 and 322. Energy is also conserved in the direct transition 340. Similarly, momentum is also conserved in the direct transition 340, because the hole 324 and the hot electron 314 have the same momentum being located at the same point in k-space. Because both energy and momentum are conserved in the direct transition 340 between the hot electron 314 and the hole 324, another particle does not mediate conservation of energy and momentum in the direct transition 340. Thus, in the direct transition 340, two events occur: the presence of the hot electron 314 at the bottom 330 of the conduction band 310 at the Γ-point of the Brillouin zone, and the presence of the hole 324 at the top 332 of a valence band, for example, one of valence bands 320 and 322, at the Γ-point of the Brillouin zone. The probability of the two events occurring simultaneously is the product of the probabilities of each occurring so that the radiative recombination rate in an indirect-bandgap semiconductor, such as Ge, for the direct transition 340 at the Γ-point with the bandgap energy 336, $E_Γ$, may be higher than the probability of the three events occurring simultaneously for the indirect transition 240 described above in the discussion of FIG. 2, if the states around the bottom 330 of the valley in the conduction band 310 at the Γ-point are sufficiently filled by electrons. In order for the radiative recombination rate in the indirect-bandgap semiconductor for the direct transition 340 at the Γ-point to approach that for a direct transition in a direct bandgap semiconductor, such as GaAs, the occupation of states by electrons, as indicated by the plurality of electrons (shown as "black dots"), at the bottom 330 of the valley in the conduction band 310 at the Γ-point is increased by embodiments of the present technology.

With further reference to FIG. 3, embodiments of the present technology increase the occupation of states by electrons at the bottom 330 of the valley in the conduction band 310 at the Γ-point by generating a hot electron-hole microplasma, one form of a hot electron-hole plasma, in the structure of the indirect-bandgap-semiconductor LED, for example, indirect-bandgap-semiconductor LED 401 which is subsequently described in FIG. 4. The hot electron-hole microplasma can be generated by reverse biasing the indirect-bandgap-semiconductor LED. Electrons and holes produced in the microplasma by impact ionization are multiplied and may create a population of high-energy electrons and holes, known by the terms of art "hot electrons" and "hot holes," respectively, with a spread of momenta. The hot electrons can then fill higher energy states in the conduction band 310 and, in particular, the higher energy states located at the bottom 330 of the valley in the conduction band 310 at the Γ-point. In addition, radiationless processes, such as an Auger transition, between the hot electrons and hot holes produced in the microplasma may result in the further production of hot electrons, for example, hot electron 314, with the energy and momenta to occupy energy states at the bottom 330 of the valley in the conduction band 310 at the Γ-point. For example, a transition 350 of an electron 312 from the bottom 334 of the conduction band 310 at the Γ-point to the higher energy states located at the bottom 330 of the valley in the conduction band 310 at the Γ-point, as a hot electron 314, may occur by the processes of impact ionization and Auger transition in the hot electron-hole microplasma, which are subsequently described in greater detail. Direct recombination 340 of hot electrons, for example, similar to hot electron 314, in states around the bottom 330 of the valley in the conduction band 310 at the Γ-point with holes, for example, hole 324, at the top of the valence bands 320 and 322 is by a fast process so that the radiative recombination rate for luminescence by these hot electrons is much greater than the radiative recombination rate for luminescence by the slow process of the indirect transition 240 described above in the discussion of FIG. 2. Thus, the use of the term of art "hot-electron-luminescence LED" coined by the inventors to describe embodiments of the present technology for the indirect-bandgap-semiconductor LED may be more fully appreciated. In accordance with embodiments of the present technology, details of the structure of the indirect-bandgap-semiconductor LED, which are utilized to generate the hot electron-hole microplasma, are next described.

Figure 4:
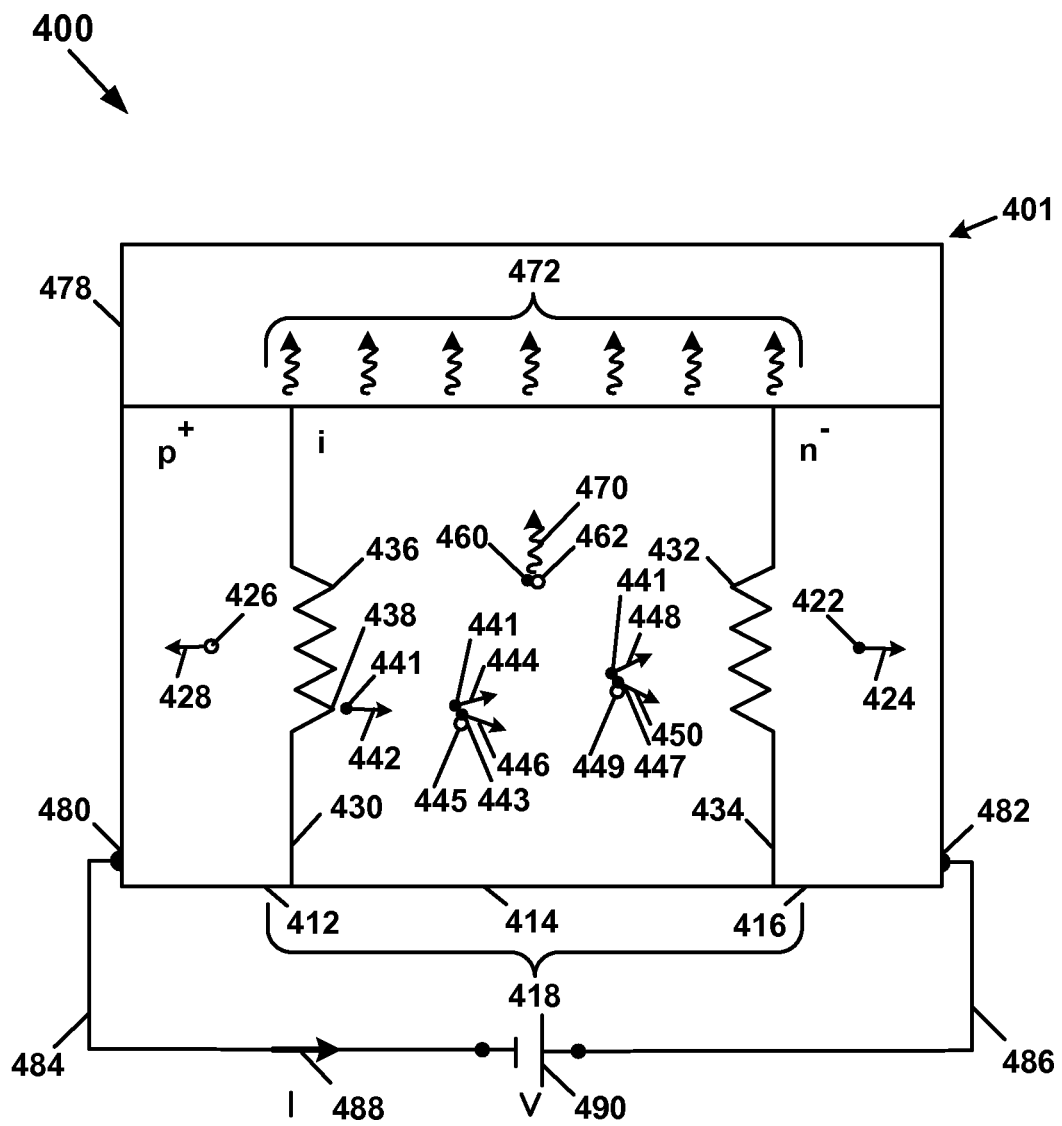
FIG. 4 is a cross-sectional elevation view of an indirect-bandgap-semiconductor LED illustrating the functional arrangement of a p-doped portion, an intrinsic portion, a n-doped portion, a p-i junction, and an i-n junction of a p-i-n diode structure in which the p-i junction and the i-n junction are configured to facilitate formation of at least one hot electron-hole plasma in the intrinsic portion when the indirect-bandgap LED is reverse biased and to facilitate luminescence produced by recombination of a hot electron with a hole, in an embodiment of the present technology.

With reference now to FIG. 4, in accordance with an embodiment of the present technology, a cross-sectional elevation view 400 of an indirect-bandgap-semiconductor LED 401 is shown. FIG. 4 illustrates the functional arrangement of a p-doped portion 412, an intrinsic portion 414, a n-doped portion 416, a p-i junction 430, and an i-n junction 434 in a p-i-n diode structure 418 of the indirect-bandgap-semiconductor LED 401. The indirect-bandgap-semiconductor LED 401 includes a plurality of portions including the p-doped portion 412 of the indirect-bandgap semiconductor, the intrinsic portion 414 of an indirect-bandgap semiconductor, and the n-doped portion 416 of an indirect-bandgap semiconductor. The intrinsic portion 414 is disposed between the p-doped portion 412 and the n-doped portion 416 and forms the p-i junction 430 with the p-doped portion 412, and the i-n junction 434 with the n-doped portion 416. The p-i junction 430 and the i-n junction 434 are configured to facilitate formation of at least one hot electron-hole plasma, for example, a hot electron-hole microplasma as described above, in the intrinsic portion 414 when the indirect-bandgap-semiconductor LED 401 is reverse biased, and to facilitate luminescence produced by recombination of a hot electron with a hole. As shown in FIG. 4, a reverse voltage bias is applied to the p-i-n diode structure 418 by an external voltage source 490, represented by the battery in FIG. 4, with voltage, V. The voltage source 490 causes a current 488, I, to flow in a circuit through the p-i-n diode structure 418 provided by the leads 484 and 486, which make contact to the p-doped portion 412 and the n-doped portion 416 at contacts 480 and 482, respectively. The majority carriers in the p-doped portion 412 are holes, for example, hole 426, which flow to the negative terminal of the voltage source through the contact 480 and lead 484 with a hole current 428 in the p-doped portion 412, when the voltage, V, is applied to the p-i-n diode structure 418. Similarly, the majority carriers in the n-doped portion 416 are electrons, for example, electron 422, which flow to the positive terminal of the voltage source through the contact 482 and lead 486 with an electron current 424 in the n-doped portion 416, when the voltage, V, is applied to the p-i-n diode structure 418. The p-i junction 430 may further include a first electric-field-enhancement structure 436, as indicated by the pointed asperity facing the right of FIG. 4 at the p-n junction 430, configured to facilitate formation of the at least one hot electron-hole plasma. Similarly, the i-n junction 434 may further include a second electric-field-enhancement structure 432, as indicated by the pointed asperity facing the left of FIG. 4 at the i-n junction 434, configured to facilitate formation of the at least one hot electron-hole plasma. When a sufficiently high voltage is applied to the p-i-n diode structure 418, the electric field at an electric-field-enhancement structure 438 may be increased such that the electric-field-enhancement structure 438 may provide a site for formation of a hot electron-hole microplasma, which is next described.

With further reference to FIG. 4, in accordance with an embodiment of the present technology, at the electric-field-enhancement structure 438 an electron 441 will be accelerated by the localized electric field so that it acquires a momentum 442. As the electron 441 proceeds through the intrinsic portion 414 of the p-i-n diode structure 418 the electron 441 may collide with an atom in the intrinsic portion 414 to produce an electron-hole pair by impact ionization, represented by electron 443 and hole 445. The collision of electron 441 with the atom in the intrinsic portion 414 imparts momentum 446 to the electron 443 with a change in the momentum of the electron 441 to momentum 444. The electron 443 and hole 445 may then be further accelerated by the applied electric field due to the voltage source 490, similarly causing further impact-ionization events of their own with the associated formation of further electron-hole pairs. The electron 441 continues to proceed through the intrinsic portion 414 of the p-i-n diode structure 418 the electron 441 further colliding with a second atom in the intrinsic portion 414 to produce a further electron-hole pair by impact ionization, represented by electron 447 and hole 449. The collision of electron 441 with the second atom in the intrinsic portion 414 imparts momentum 450 to the electron 447 with a change in the momentum of the electron 441 to momentum 448. Similarly, the electron 447 and hole 449 may then be further accelerated by the applied electric field due to the voltage source 490, similarly causing further impact-ionization events of their own with the associated formation of further electron-hole pairs. Thus, the applied electric field due to the voltage source 490 increases the energy of the electron 441 in the conduction band 310 and changes the momentum of the electron 441 from the resulting scattering processes, for example, the inelastic scattering processes of impact ionization, as the electron 441 traverses the intrinsic portion 414 of the p-i-n diode structure 418. Also, with the production of additional electron-hole pairs due to impact ionization events in the intrinsic portion 414 of the p-i-n diode structure 418, a large number of hot electrons may be created with sufficient energy and the appropriate momentum to occupy the energy states located at the bottom 330 of the valley in the conduction band 310 at the Γ-point populating the states in this portion of the conduction band 310. Moreover, radiationless processes, such as Auger transitions, between the hot electrons and hot holes produced by the microplasma may provide an additional source of hot electrons with the energy and momentum to fill energy states at the bottom 330 of the valley in the conduction band 310 at the Γ-point.

Thus, in accordance with an embodiment of the present technology, and with further reference to FIG. 4, promotion of electrons to the bottom 330 of the valley in the conduction band 310 at the Γ-point is achieved by creating a hot electron-hole microplasma in p-i-n diode structure 418. The microplasma is created due to a specific positive feedback effect. The principal features of the positive feedback effect are believed to be as follows. Impact ionization initiated by the electrons in the intrinsic portion 414 increases the density of electrons, n, and produces hot electrons, which enhance a carrier avalanche. The carrier avalanche, in turn, increases the density of electrons, n, which leads to the spontaneous loss of homogeneity in the hot electron-hole plasma and the formation of a hot electron-hole microplasma confined to current-carrying filaments in p-i-n diode structure 418. The current density in the filaments approaches $10^9$ Amperes per centimeter squared ($A/cm^2$), but does not lead to any substantial heating of the matrix. Two simultaneous processes will take place when the diode is reversed biased to produce the electric field that enables avalanche breakdown: first, a hot electron-hole plasma will be generated that leads to current bunching without any macroscopic sigma-like nonlinearity in the I-V characteristic of the p-i-n diode structure 418; and, second, minority-carrier electrons, accelerated in the p-doped portion 412 in the avalanche regime, gain energy and create more electron carriers that subsequently undergo an up-conversion by an Auger transition to the Γ-point in the conduction band 310. Some hot electrons also undergo up-conversion due to extensive electron-electron collisions, or electron-electron scattering. The avalanche process creates multiple electron carriers at the bottom of the conduction band (L-point in Ge, X-point in Si). Thermalization of hot electrons due to vigorous electron-electron collisions leads to a population of the states at the Γ-point by electrons. Up-conversion by an Auger transition may also take place and, as a result of radiationless recombination of a hot electron with a hot hole, as previously described, which passes energy to another hot electron that is up-converted to Γ-point. With sufficient hot electrons populating the states at the bottom 330 of the valley in the conduction band 310 at the Γ-point and sufficient holes populating the states at the top 332 of the valence bands 320 and 322 at the Γ-point, the conditions are set for the production of photons, or light, with a relatively large radiative recombination rate in the indirect-bandgap-semiconductor LED 401, which is next described.

With further reference to FIG. 4, in accordance with an embodiment of the present technology, hot electrons and hot holes produced by the hot electron-hole microplasma, for example, hot electron 460 and hole 462, may recombine in the intrinsic portion 414 and other portions of the p-i-n diode structure 418 of the indirect-bandgap-semiconductor LED 401 to produce light, for example, as indicated by photon 470. Thus, at least one hot electron-hole plasma, for example, a hot electron-hole microplasma in the intrinsic portion 414 of the p-i-n diode structure 418, may facilitate luminescence by providing a source of carriers for direct recombination of a hot electron with a hole. In accordance with an embodiment of the present technology, the indirect-bandgap semiconductor of the indirect-bandgap-semiconductor LED 401 may be selected from the group including Si, Ge or a Si—Ge alloy; alternatively, the indirect-bandgap semiconductor of the indirect-bandgap-semiconductor LED 401 may be selected from the group consisting of Si, Ge and a Si—Ge alloy. The composition of the Si—Ge alloy may be adjusted to provide a bandgap, for example, at the Γ-point with bandgap energy 336, $E_\Gamma$, of the Si—Ge alloy for production of light with a wavelength between about 850 nanometers (nm) and about 1600 nm. In particular, the composition of the Si—Ge alloy may be adjusted to produce light with a wavelength of about 850 nm. The indirect-bandgap-semiconductor LED 401 may further include a light collector 478 for collecting photons 472 from and optically coupled with at least one portion selected from the plurality of portions including the p-doped portion 412, the intrinsic portion 414 or the n-doped portion 416. Alternatively, the indirect-bandgap-semiconductor LED 401 may further include a light collector 478 for collecting photons 472 from and optically coupled with at least one portion selected from the plurality of portions consisting of the p-doped portion 412, the intrinsic portion 414 and the n-doped portion 416. In accordance with an embodiment of the present technology, the light collector 478 may include a portion of a light modulator, for example, similar to light modulator 130. Alternatively, the light collector 478 may be optically coupled with the light modulator, for example, similar to light modulator 130, through a grating.

Thus, in accordance with an embodiment of the present technology, the avalanche process creates current bunching in the intrinsic portion 414 of the p-i-n diode structure 418 in absence of the nonlinearity in the I-V characteristic of the indirect-bandgap-semiconductor LED 401. For an approximately 1 micrometer (μm) thick intrinsic portion 414, where thickness of the intrinsic portion 414 is measured by the distance between the p-doped portion 412 and the n-doped portion 416 on either side of the intrinsic portion 414, the electric field is greater than approximately 10 kilovolts per centimeter (kV/cm). In the current filaments of the hot electron-hole microplasma, which appear as self-organized structures, the density of electrons, n, and holes, p, is approximately $10^{19}/cm^3$ with a current density, j, around approximately $10^9$ $A/cm^2$. If the light collector 478 that is optically coupled with a light modulator, for example, similar to light modulator 130, is monolithically integrated on top of a lateral p-i-n diode structure 418, as shown in FIG. 4, the p-i-n diode structure 418 may generate light in the continuous wave (CW) regime, which may be modulated by an integrated modulator, for example, similar to light modulator 130, with a speed sufficient for communication between ICs. The radiative emission should have a standard speed for direct transitions with a frequency, $\tau^{-1}$, greater than or equal to 3-5 giga-Hertz (GHz). The indirect-bandgap-semiconductor LED 401 can be used as a source of CW radiation that can be coupled by a grating to an adjacent integrated modulator, for example, a ring, or alternatively a Mach-Zehnder interferometer, for producing the modulated light signal, for example, the modulated light signal, represented by the photon 154 of FIG. 1, at a desired frequency. Moreover, the design of the indirect-bandgap-semiconductor LED 401 could be optimized for a particular operational wavelength, for example, 850 nm, by suitable choice of materials, circuit layout and integration scheme. Thus, the indirect-bandgap-semiconductor LED 401 may provide a source of CW radiation that is tunable to a desired frequency, for example, 850 nm; and, being based on Si, Ge, or Si—Ge, the indirect-bandgap-semiconductor LED 401 would be compatible with Si-based CMOS technology and monolithically integrable with light modulators and optical waveguides based on silicon-on-insulator (SOI) technology to provide optical output drivers for optical interconnection and communication between ICs.

The foregoing descriptions of specific embodiments of the present technology have been presented for purposes of illustration and description. They are not intended to be exhaustive or to limit the technology to the precise forms disclosed, and many modifications and variations are possible in light of the above teaching. The embodiments described herein were chosen and described in order to best explain the principles of the technology and its practical application, to thereby enable others skilled in the art to best utilize the technology and various embodiments with various modifications as are suited to the particular use contemplated. It may be intended that the scope of the technology be defined by the claims appended hereto and their equivalents.

What is claimed is:

1. An indirect-bandgap-semiconductor, light-emitting diode comprising:
    a plurality of portions comprising:
        a p-doped portion of an indirect-bandgap semiconductor, an intrinsic portion of an indirect-bandgap semiconductor, and a n-doped portion of an indirectbandgap semiconductor, said intrinsic portion disposed between said p-doped portion and said n-doped portion and forming a p-i junction with said p-doped portion and an i-n junction with said n-doped portion;
        wherein said p-i junction and said i-n junction are configured to facilitate formation of at least one hot electron-hole plasma in said intrinsic portion when said indirect-bandgap, light-emitting diode is reverse biased and to facilitate luminescence produced by recombination of a hot electron with a hole.

2. The indirect-bandgap-semiconductor, light-emitting diode of claim 1, wherein said indirect-bandgap semiconductor is selected from the group consisting of silicon, germanium and a silicon-germanium alloy.

3. The indirect-bandgap-semiconductor, light-emitting diode of claim 2, wherein a composition of said silicon-germanium alloy is adjusted to provide a bandgap of said silicon-germanium alloy for production of light with a wavelength between about 850 nm and about 1600 nm.

4. The indirect-bandgap-semiconductor, light-emitting diode of claim 2, wherein a composition of said silicon-germanium alloy is adjusted to produce light with a wavelength of about 850 nm.

5. The indirect-bandgap-semiconductor, light-emitting diode of claim 2, wherein said p-i junction further comprises a first electric-field-enhancement structure configured to initiate the formation of said at least one hot electron-hole plasma.

6. The indirect-bandgap-semiconductor, light-emitting diode of claim 2, wherein said i-n junction further comprises a second electric-field-enhancement structure configured to initiate the formation of said at least one hot electron-hole plasma.

7. The indirect-bandgap-semiconductor, light-emitting diode of claim 2, wherein said at least one hot electron-hole plasma facilitates luminescence by providing a source of hot electrons for direct recombination of said hot electron with said hole.

8. The indirect-bandgap-semiconductor, light-emitting diode of claim 1, further comprising a light collector optically coupled with at least one portion selected from the plurality of portions consisting of said p-doped portion, said intrinsic portion and said n-doped portion.

9. The indirect-bandgap-semiconductor, light-emitting diode of claim 1, wherein said p-i junction further comprises a first electric-field-enhancement structure configured to initiate the formation of said at least one hot electron-hole plasma.

10. The indirect-bandgap-semiconductor, light-emitting diode of claim 9, wherein said at least one hot electron-hole plasma facilitates luminescence by providing a source of hot electrons for direct recombination of said hot electron with said hole.

11. The indirect-bandgap-semiconductor, light-emitting diode of claim 1, wherein said i-n junction further comprises a second electric-field-enhancement structure configured to initiate the formation of said at least one hot electron-hole plasma.

12. The indirect-bandgap-semiconductor, light-emitting diode of claim 11, wherein said at least one hot electron-hole plasma facilitates luminescence by providing a source of hot electrons for direct recombination of said hot electron with said hole.

13. The indirect-bandgap-semiconductor, light-emitting diode of claim 1, wherein said at least one hot electron-hole plasma facilitates luminescence by providing a source of hot electrons for direct recombination of said hot electron with said hole.

14. A combined indirect-bandgap-semiconductor, light-emitting diode and light modulator device, said device comprising:
    an indirect-bandgap-semiconductor, light-emitting diode integrated with said light modulator, said indirect-bandgap-semiconductor, light-emitting diode comprising:
        a plurality of portions comprising:
            a p-doped portion of an indirect-bandgap semiconductor, an intrinsic portion of an indirect-bandgap semiconductor, and a n-doped portion of an indirect-bandgap semiconductor, said intrinsic portion disposed between said p-doped portion and said n-doped portion and forming a p-i junction with said p-doped portion and an i-n junction with said n-doped portion;
            wherein said p-i junction and said i-n junction are configured to facilitate formation of at least one hot electron-hole plasma in said intrinsic portion when said indirect-bandgap, light-emitting diode is reverse biased and to facilitate luminescence produced by recombination of a hot electron with a hole; and
    a light modulator optically coupled with at least one of said plurality of portions for modulating light emitted from said at least one of said portions.

15. The device of claim 14, wherein said indirect-bandgap semiconductor is selected from the group consisting of silicon, germanium and a silicon-germanium alloy.

16. The device of claim 14, further comprising a light collector optically coupled with at least one portion selected from the plurality of portions consisting of said p-doped portion, said intrinsic portion and said n-doped portion.

17. The device of claim 16, wherein said light collector is optically coupled with said light modulator.

18. The device of claim 14, wherein said light modulator further comprises a Mach-Zehnder interferometer.

19. A combined indirect-bandgap-semiconductor, light-emitting diode, light modulator and integrated-circuit device, said device comprising:
    an integrated-circuit; and
    a combined indirect-bandgap-semiconductor, light-emitting diode and light modulator device, said combined indirect-bandgap-semiconductor, light-emitting diode and light modulator device comprising:
        an indirect-bandgap-semiconductor, light-emitting diode integrated with said light modulator, said indirect-bandgap-semiconductor, light-emitting diode comprising:
            a plurality of portions comprising:
                a p-doped portion of an indirect-bandgap semiconductor, an intrinsic portion of an indirect-bandgap semiconductor, and a n-doped portion of an indirect-bandgap semiconductor, said intrinsic portion disposed between said p-doped portion and said n-doped portion and forming a p-i junction with said p-doped portion and an i-n junction with said n-doped portion;

wherein said p-i junction and said i-n junction are configured to facilitate formation of at least one hot electron-hole plasma in said intrinsic portion when said indirect-bandgap, light-emitting diode is reverse biased and to facilitate luminescence produced by recombination of a hot electron with a hole; and a light modulator optically coupled with at least one of said plurality of portions for modulating light emitted from said at least one of said portions; and wherein said light modulator is configured to receive a signal from said integrated circuit for modulating light emitted from said at least one of said portions.

20. The device of claim 19, wherein said integrated circuit further comprises a complementary-metal-oxide-semiconductor (CMOS) silicon integrated circuit.

\* \* \* \* \*

UNITED STATES PATENT AND TRADEMARK OFFICE
CERTIFICATE OF CORRECTION

PATENT NO.        : 8,471,270 B2                                Page 1 of 1
APPLICATION NO.   : 13/257393
DATED             : June 25, 2013
INVENTOR(S)       : Alexandre M. Bratkovski et al.

It is certified that error appears in the above-identified patent and that said Letters Patent is hereby corrected as shown below:

In the Claims

In column 11, lines 17-18, in Claim 1, delete "indirectbandgap" and insert -- indirect-bandgap --, therefor.

Signed and Sealed this
Fifth Day of November, 2013

Teresa Stanek Rea
*Deputy Director of the United States Patent and Trademark Office*